(12) United States Patent
Vanhyfte et al.

(10) Patent No.: US 8,363,387 B2
(45) Date of Patent: Jan. 29, 2013

(54) MODULARLY CONSTRUCTED CONVERTER ARRANGEMENT

(75) Inventors: Francois Vanhyfte, Montmagny (FR); Briag Allain, Montesson (FR)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 248 days.

(21) Appl. No.: 12/917,316

(22) Filed: Nov. 1, 2010

(65) Prior Publication Data

US 2011/0110021 A1 May 12, 2011

(30) Foreign Application Priority Data

Oct. 31, 2009 (DE) .......................... 10 2009 051 518

(51) Int. Cl.
*H02B 11/12* (2006.01)
*H05K 7/20* (2006.01)
(52) U.S. Cl. ......... 361/608; 361/622; 361/676; 361/715
(58) Field of Classification Search .................. 361/608, 361/676–678
See application file for complete search history.

(56) References Cited

U.S. PATENT DOCUMENTS

| | | | |
|---|---|---|---|
| 4,691,274 A | | 9/1987 | Matouk et al. |
| 4,731,703 A | * | 3/1988 | Tsukaguchi et al. ........... 361/727 |
| 4,772,899 A | * | 9/1988 | Mamiya et al. ........... 346/139 R |
| 5,185,705 A | * | 2/1993 | Farrington ..................... 700/292 |
| 5,497,289 A | * | 3/1996 | Sugishima et al. ........... 361/709 |
| 5,680,294 A | | 10/1997 | Stora et al. |
| 6,657,320 B1 | * | 12/2003 | Andrews et al. ................. 307/64 |
| 7,492,621 B2 | * | 2/2009 | Wobben ........................ 363/144 |
| 7,639,510 B2 | * | 12/2009 | Fritz et al. ..................... 361/760 |
| 7,663,263 B2 | * | 2/2010 | Wobben .......................... 290/55 |
| 7,719,865 B2 | * | 5/2010 | Iwata et al. ..................... 363/71 |
| 2003/0116413 A1 | * | 6/2003 | Narusevicius et al. ..... 200/50.21 |

FOREIGN PATENT DOCUMENTS

| | | |
|---|---|---|
| DE | 37 13054 | 11/1987 |
| DE | 696 28 495 T2 | 10/1996 |
| DE | 29917467 U1 | 12/1999 |
| DE | 198 32 225 | 1/2000 |
| EP | 0735810 A2 | 10/1996 |
| EP | 2 023 473 | 2/2009 |

OTHER PUBLICATIONS

European Search Report for EPO Ser. No. 10 17 0742 dated May 21, 2012.

* cited by examiner

*Primary Examiner* — Gregory Thompson
(74) *Attorney, Agent, or Firm* — The Law Offices of Roger S. Thompson

(57) ABSTRACT

A converter arrangement comprising a switchgear cabinet for a plurality of converter assemblies forming respective main modules and each consisting of submodules, formed as a switching module and a capacitor module. The switchgear cabinet has connection devices for electrical connection of the converter assemblies and also, for each converter assembly, a rail system for the mechanical arrangement thereof. The capacitor module has a DC voltage contact device for electrical connection to the assigned switching module, and also sliding elements. The switching module has a cooling device, power semiconductor modules and also dedicated sliding elements. The sliding elements of the submodules are arranged in a stacked manner in the same rails of the rail system of the switchgear cabinet.

7 Claims, 6 Drawing Sheets

US 8,363,387 B2

MODULARLY CONSTRUCTED CONVERTER ARRANGEMENT

BACKGROUND OF THE INVENTION

1. Field of the Invention

The invention is directed to a modular converter arrangement such as is used in parallel arrangement, for example in wind power or photovoltaic installations, for matching currents generated therein to a power supply system.

2. Description of the Related Art

Wind power installations generate temporally varying output voltages at a likewise varying frequency depending on the wind speed. Temporally varying DC voltage is usually generated in photovoltaic installations. However, feeding the power generated thereby into a power supply system usually necessitates the generation of a defined AC voltage at a constant frequency.

For this purpose, cascaded arrangements of commercially available power semiconductor modules are described in German Patent Application DE 198 32 225 A1, for example. If such cascaded arrangements are connected to form a converter arrangement, it is important to provide ease of servicing thereof, that is to say the replacing of defective components must be simple and fast.

SUMMARY OF THE INVENTION

It is therefore an object of the invention to provide a modular converter arrangement constructed from individual converter assemblies which are simple to build and simple and rapid to repair.

The inventive modular converter arrangement is formed from a plurality of, preferably, substantially identical converter assemblies, arranged in a receptacle, which is usually formed as a switchgear cabinet. The converter assemblies thus form main modules of the converter arrangement, which for their part are in turn constructed from submodules, namely a capacitor module and a switching module. For the circuit-conforming electrical connection of the main modules or submodules, the receptacle has a connection device, which is preferably formed as a DC voltage connection having two polarities and an AC voltage connection device having at least one phase, usually three phases.

In the preferred embodiment, the capacitor module has in each case a plurality of capacitors and also at least one DC voltage contact device for electrical connection to a DC voltage contact device of the assigned switching module and preferably also to the DC voltage connection device of the receptacle device. It may be preferred to form this module by one common or two spatially separated DC voltage contact devices.

Also in the preferred embodiment, the switching module includes a cooling device, at least one power semiconductor module arranged thereon, an AC voltage contact device and a DC voltage contact device. The DC voltage contact device permits connection to the assigned DC voltage contact device of the capacitor module, as a result of which, by way of example, a DC voltage intermediate circuit and a half-bridge circuit connected thereto are formed. A three-phase bridge circuit with a connected intermediate circuit can thus be formed by the arrangement of three main modules. In this case, energy is temporarily stored in the intermediate circuit, converted into a voltage having the required frequency in the bridge circuit and fed into a power supply system by the AC voltage contact devices of the respective switching modules and the connection device of the receptacle device.

According to the invention, the receptacle has a respective rail system for the mechanical arrangement of the main modules or submodules, the rail system preferably being formed by two U-profiles that extend from a rear side to a front side of the receptacle. Each submodule has sliding elements which are suitable for this purpose and which can be arranged in the rail system and therefore enable the respective submodule to be mounted and demounted from the front side.

In this case, as viewed from the rear side to the front side, the connection device of the receptacle device, the respective capacitor module and the assigned switching module form a stack. In such an arrangement, the circuit-conforming electrical connections of the respective parts of the stack may also be formed. What is essential in this case is that the necessary connections, preferably screw connections, for mounting and demounting the switching module and also the main module, formed from the capacitor module and the switching module, may be reached from the front side of the receptacle. Consequently, firstly, this modularly constructed converter arrangement can be produced in a simple manner and, moreover, its components can also be replaced in a simple manner during servicing.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
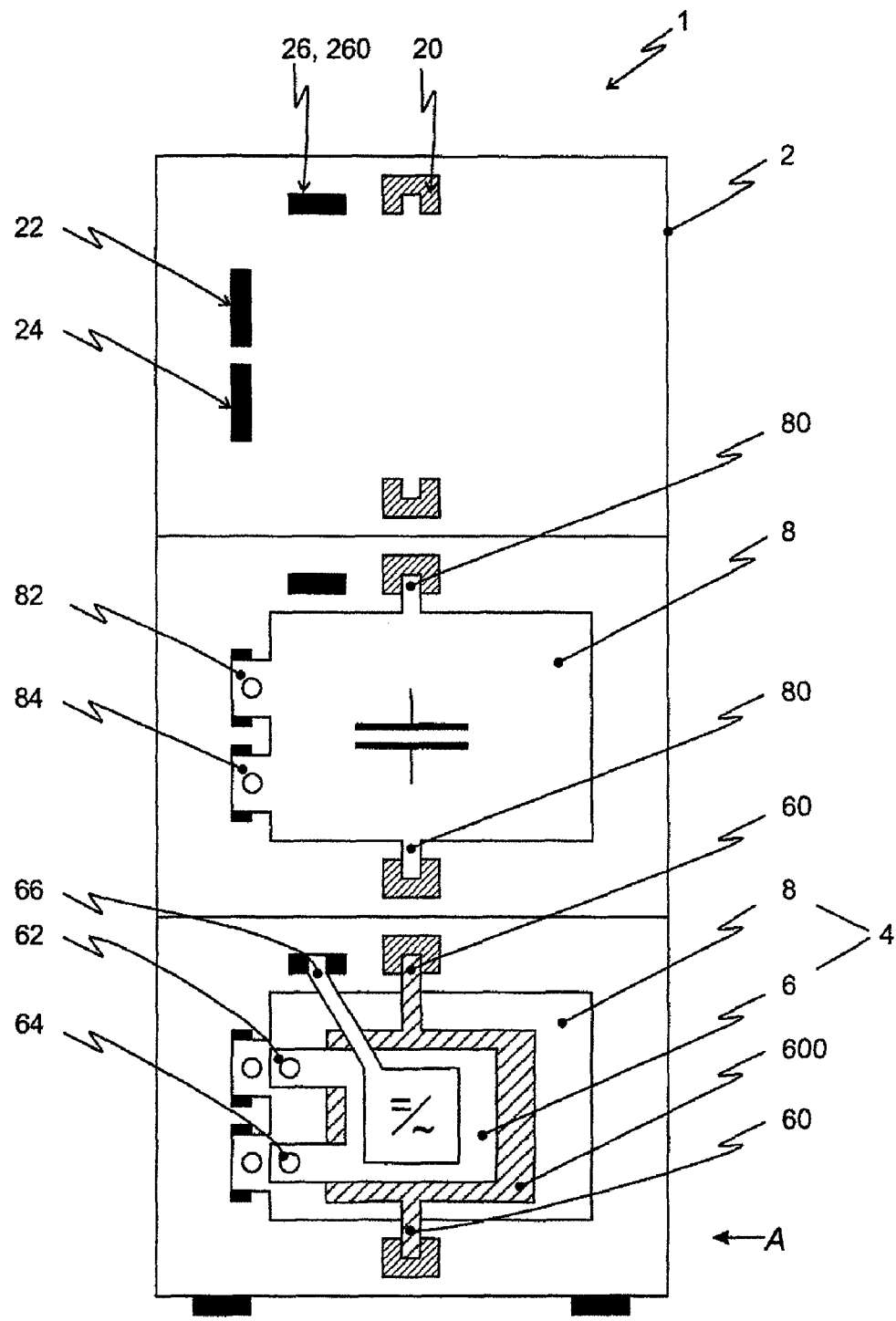
FIG. 1 shows a highly schematic view from the front side of the inventive converter arrangement.

FIG. 1 shows a highly schematic view from the front side of an inventive converter arrangement shown generally at 1. Converter arrangement 1 comprises a receptacle 2 preferably embodied as a switchgear cabinet and having three receptacles for main modules 4, wherein a main module 4 is arranged in the lower receptacle, only a capacitor module 8 is arranged in the middle receptacle and no module is arranged in the upper receptacle.

FIG. 1 shows in each case a rail system 20, formed as two U-shaped guides extending from the front side to the rear side of the switchgear cabinet 2. The illustration likewise shows here connection devices 22, 24, 26 of switchgear cabinet 2, in each case two parts of the DC voltage connection device 22, 24 for the two polarities and also an AC voltage connection device 26.

A submodule, capacitor module 8, is arranged in the middle receptacle. For this purpose, it has in each case at least one sliding element 60 arranged in respectively assigned U-profiles of rail system 20. By means of sliding elements 60, a submodule 6 can be mounted in switchgear cabinet 2 from the front side, and demounted towards the front side. For this purpose it is merely necessary to release the electrical and mechanical connections.

In the lower receptacle, switching module 6 is also arranged therein in addition to capacitor module 8. Switching module 6 can be mounted when capacitor module 8 has already been mounted, and can also be demounted separately from the latter. For this purpose, switching module 6 is also provided with sliding elements 60 arranged in the same rails 20 as those of capacitor module 80. For the necessary electrical connection, respective DC voltage contact devices 22, 24 of submodules 6, 8 are connected to one another in a circuit-conforming manner. If this connection is formed in a suitable manner, further mechanical fixing of the switching module 6 to switchgear cabinet 2 can be omitted.

AC voltage contact device 66 of switching module 6 is furthermore illustrated, wherein this contact device is connected to AC voltage connection device 26 by an additional section 260 arranged parallel to rail system 20. In this case, additional section 260 does not restrict the movement of main module 4 nor of individual submodules 6, 8 along rail system 20, as a result of which mounting or demounting is not impeded.

Figure 2:
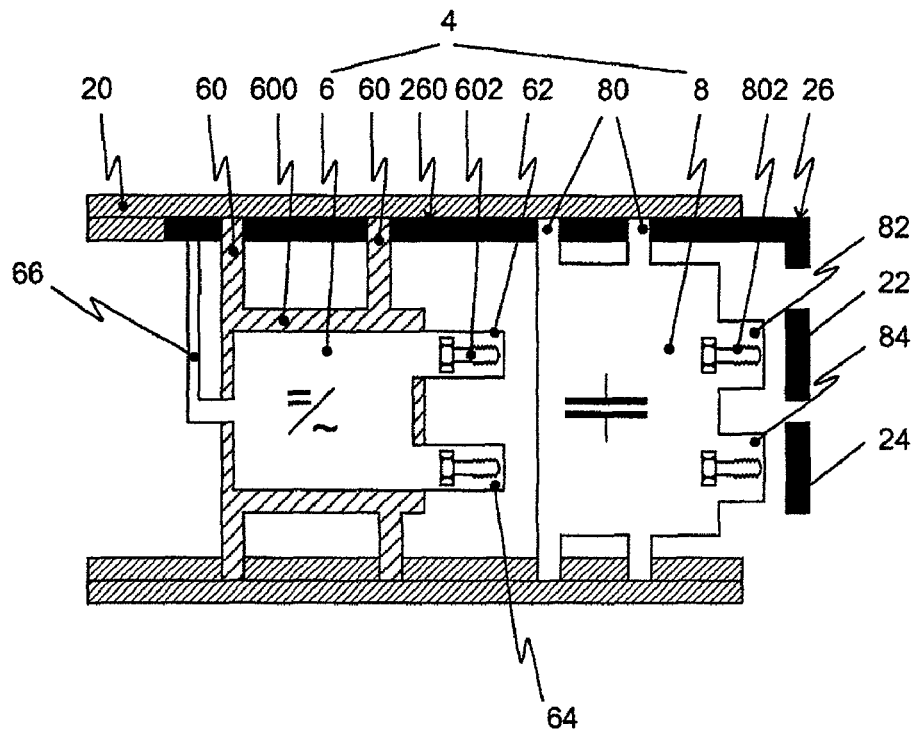
FIG. 2 shows a highly schematic associated detail view.

FIG. 2 shows the likewise highly schematic detail view analogously to the configuration of a part of converter device 1 in accordance with FIG. 1 in side view from the viewing direction A. This reveals a stacked arrangement of connection device 22, 24, 26 of switchgear cabinet 2 in its rear region, of capacitor module 8 and of switching module 6, illustrated in each case in a manner spaced apart from one another.

Connection device 22, 24, 26 here again has two DC voltage connection devices 22, 24 and an AC voltage connection device 26, wherein the latter has an additional section 260 arranged parallel to rail system 20, specifically to the upper of the two U-shaped profiles. Section 260 extends as far as an AC voltage contact device 66 of switching module 6.

The illustration furthermore shows, per submodules 6, 8, two upper and two lower sliding elements 60, 80, for guiding the respective submodule or the main module formed therefrom in the assigned rail system 20 of switchgear cabinet 2. The advantage of the inventive modular construction of converter arrangement 1 becomes particularly clear from this lateral view. What is essential here is that the connection means of all connections, those for mounting or demounting switching module 6 or main module 4, are accessible from the front and that no components impeding the mounting or demounting extend into the movement space of submodules 6, 8.

FIGS. 3 to 7 show detailed embodiments of inventive converter arrangement 1 and of the components thereof, in various views.

Figure 3:
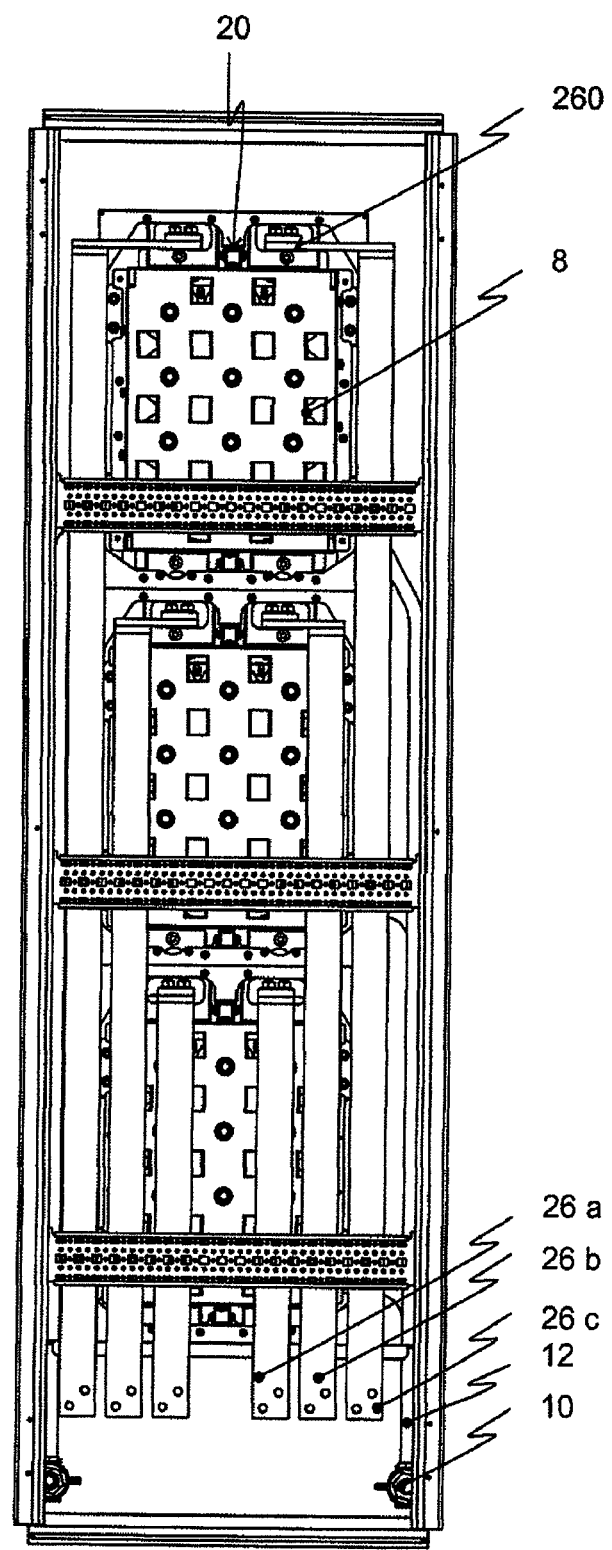

In this case, FIG. 3 shows a rear view, wherein here especially AC voltage connection device 26 a/b/c is clearly discernable, which here consists, of two planar metal bodies per phase, each having additional sections 260 parallel to the rail systems.

Figure 5:
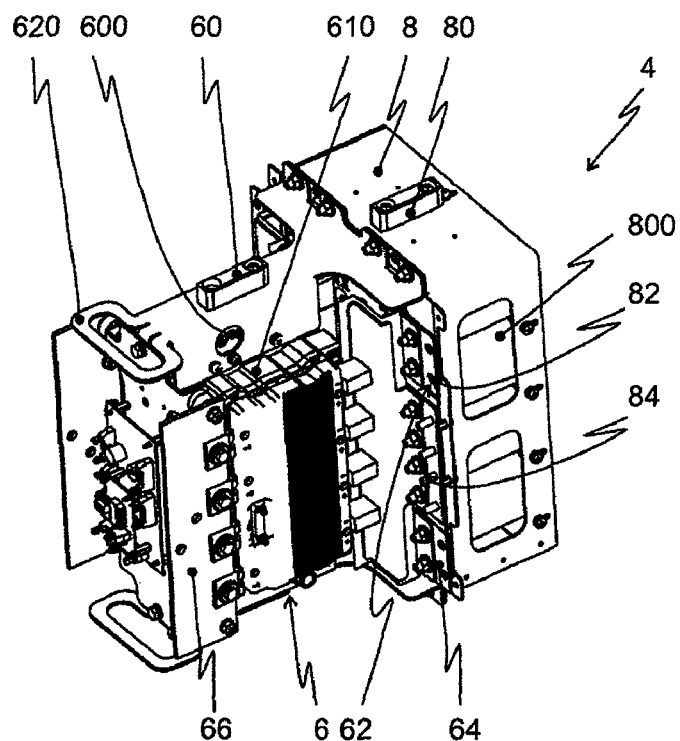
FIGS. 3 to 7 show more detailed embodiments of a converter arrangement according to the invention and of the components thereof, in various views.
Figure 4:
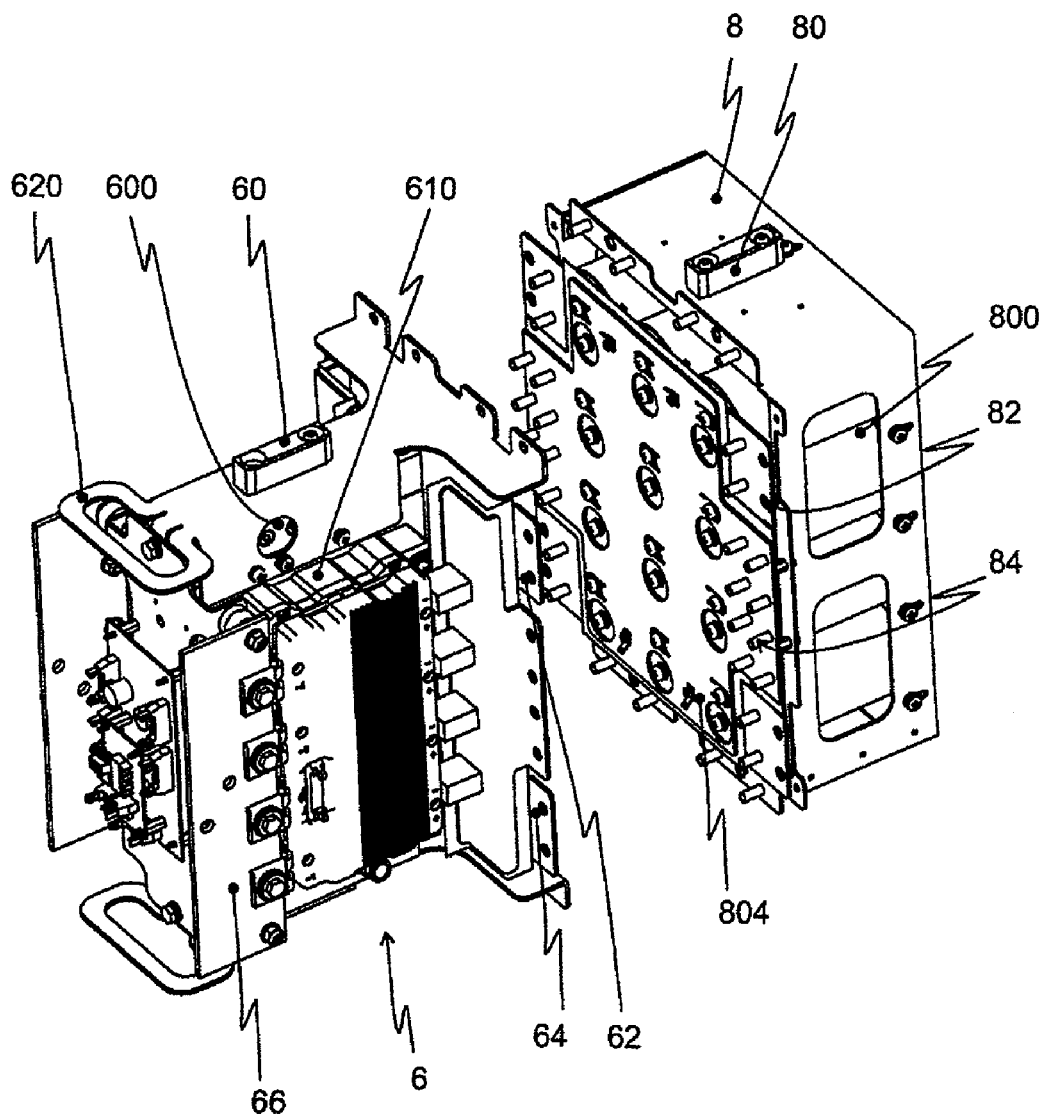

FIGS. 4 and 5 show main module 4 and submodules 6, 8—forming main module 4—of the inventive converter arrangement. In this case, capacitor module 8 has a plurality of individual capacitors 800, and also a planar connection device 804 of capacitors 800 for both polarities of the DC voltage. Connection device 804 simultaneously forms, in its lateral outer region, a DC voltage connection device 82, 84 with respect to switching module 6.

A sliding element 80 is illustrated on the top side of capacitor module 8, sliding element 80 serving, in conjunction with rail system 20 (cf. FIG. 3), for simple mounting and demounting of capacitor module 8 since, as a result of the guiding thereof in the rail system, the positioning of capacitor module 8 is free only in one dimension, i.e., along the rail.

Switching module 6 has a cooling device 600, here a water cooling device. A plurality, here four, of substantially identical power semiconductor modules 610 are in each case arranged laterally on cooling device 600 which power semiconductor modules are all connected in parallel and form a half-bridge circuit having a power of the order of magnitude of 1 MW.

On the side facing capacitor module 8, the DC voltage connection device 62, 64 of switching module 6 is assigned to power semiconductor modules 610 and connected to the DC voltage terminals of power semiconductor modules 610 in a circuit-conforming manner. The AC terminals of power semiconductor modules 610 are arranged on the side facing away from capacitor module 8 and connected to AC voltage connection device 66.

Switching module 6 has dedicated sliding devices 60 aligned with that of capacitor module 8, sliding devices 60 additionally being connected to a handle 620 for improved handling during mounting or demounting. The advantages mentioned in the description of FIG. 2 are likewise afforded here.

Figure 6:
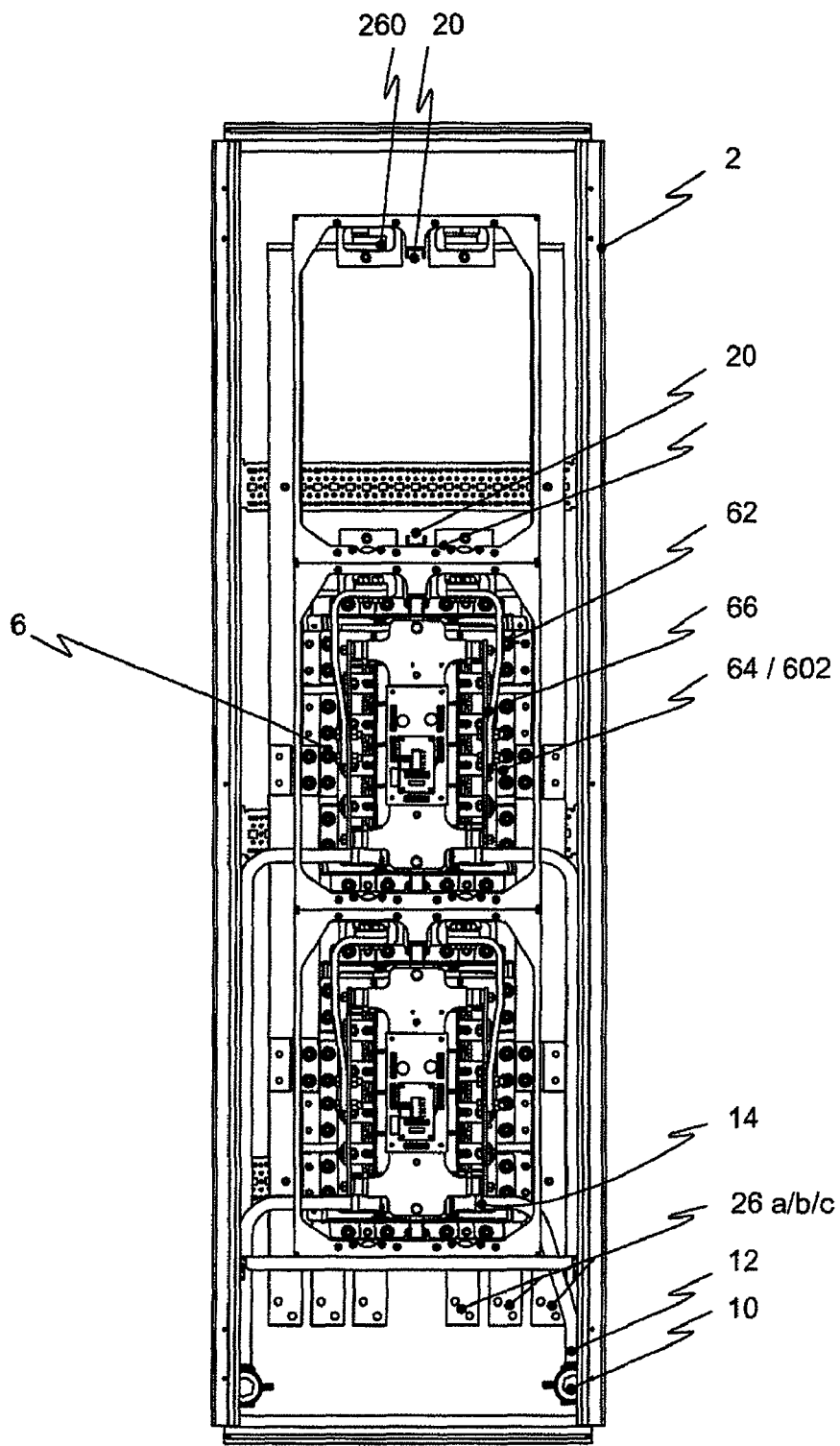
Figure 7:
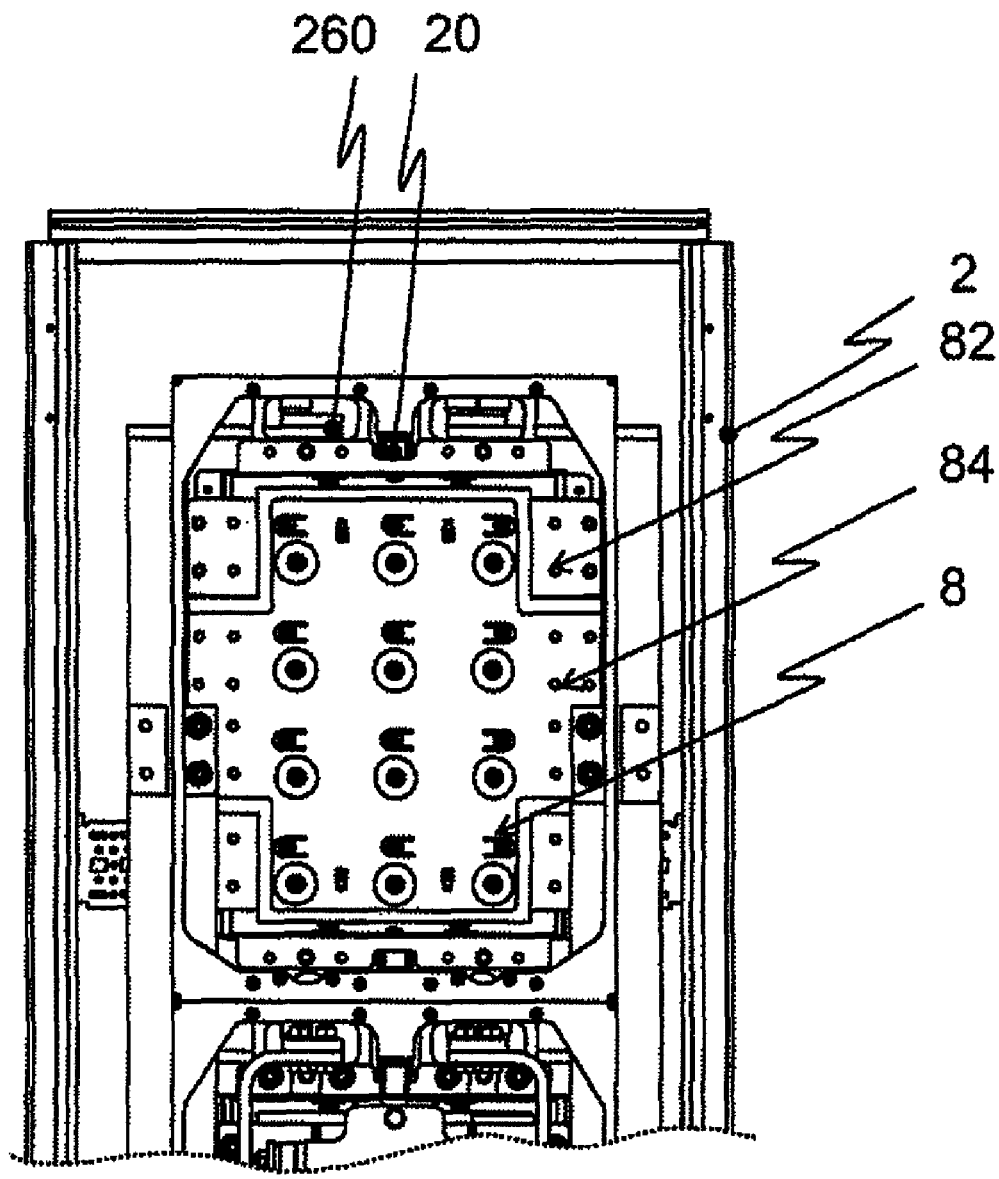

FIGS. 6 and 7 show converter arrangement 1 from the front side. In a manner corresponding to FIG. 1, FIG. 6 illustrates three receptacles, wherein the upper receptacle is not occupied, while the other two receptacles each contain a main module 4. By contrast, FIG. 7 illustrates a first receptacle occupied by a capacitor module 8.

In the rear region of switchgear cabinet 2 (cf. FIG. 3), the illustration shows AC voltage connection devices 26 a/b/c, in each case two metal bodies per phase. Rail system 20 and additional sections 260 of AC voltage connection device 26 are clearly discernable in the upper free receptacle of switchgear cabinet 2. Sliding devices 60, 80 of submodules 6, 8 or of main module 4 formed therefrom can be arranged in rails 20. Parallel to rail system 20 alongside the respective upper rail, two additional sections 260 of AC voltage connection devices 26 are arranged in such a way that they do not impede the mounting or demounting of submodules 6, 8 or main module 4 by virtue of the fact that they do not extend into the movement space required therefor.

Main modules 4 are in each case arranged in two further receptacles, of which main modules 4 power semiconductor modules 610 of switching modules 6 are clearly discernable. The DC voltage terminals of power semiconductor modules 610 are connected to DC voltage contact devices 62, 64 of switching module 6, while the latter is connected in a circuit-conforming manner, that is to say polarity-conforming manner, to the associated DC voltage contact devices 82, 84 of capacitor module 8 arranged behind it. All the connection means necessary for mounting or demounting main modules 4, such as screw connections 602, for example, are accessible from the front side.

The illustration furthermore shows central lines 10 arranged in switchgear cabinet 2, a feed line and a discharge line for cooling liquids. These central lines 10 are connected to cooling water feed lines 12 to respective switching modules, feed lines 12 being formed in a flexible manner in partial sections. Cooling water feed lines 12 connect the cooling devices of switching modules 6, said cooling devices being formed as water cooling device 600, and have on cooling device 600 a self-sealing quick-action closure 14 for simple connection.

FIG. 7 shows, in contrast to FIG. 6, a capacitor module 8 arranged in the upper receptacle, a capacitor module as already described with reference to FIGS. 4 and 5. In addition to the necessary electrical connections, capacitor module 8 additionally has alongside sliding elements 80 a further, preferably screwed, mechanical connection to switchgear cabinet 2. This mechanical connection is also arranged in such a way that it is accessible from the front side when the submodule or main module has been mounted.

In the illustrated and described configurations according to the invention of converter arrangement 1 presented, it is possible to mount individual switching modules 6 or even main modules 4 in a switchgear cabinet 2 in such a way that these parts can be demounted during servicing.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A modular converter arrangement comprising:
    a receptacle for receiving a plurality of converter assemblies forming respective main modules and each including submodules, of a switching module and a capacitor module;
    wherein said receptacle has
        at least one connection device for the circuit-conforming electrical connection of said converter assemblies and
        a rail system for each converter assembly for the mechanical arrangement of said converter assemblies;
    wherein said capacitor module has a
        plurality of capacitors,
        at least one DC voltage contact device for electrical connection to a DC voltage contact device of an assigned switching module and to said connection device of said receptacle, and
        sliding elements;
    wherein said switching module has
        a cooling device,
        at least one power semiconductor module arranged thereon,
        an AC voltage contact device and a DC voltage contact device and
        sliding elements, and
    wherein the respective sliding elements of the submodules are adapted to be arranged in a stacked manner in the same assigned rails of said rail system of said receptacle so that said connection device of said receptacle forms a first part of a stack, said capacitor module forms a second part of said stack and said switching module forms a third part of said stack and necessary circuit-conforming electrical connections of parts of said stack can thereby be formed.

2. The modular converter arrangement of claim 1, wherein said cooling device is a water cooling device, and wherein said receptacle has central lines which are adapted for connection to said cooling device by quick-action closures.

3. The modular converter arrangement of claim 1, wherein said receptacle is formed as a switchgear cabinet having a rear side on which is arranged said connection device, which is configured as a DC voltage connection device having two polarities and as an AC voltage connection device having at least one phase.

4. The modular converter arrangement of claim 3, wherein said rail system of a main module has at least two U-profiles for guiding said sliding elements of said submodules and said U-profiles extend from said rear side to a front side of said switchgear cabinet.

5. The modular converter arrangement of claim 3, wherein said DC voltage contact device of said capacitor module is electrically conductively connected to said DC voltage connection device of said switchgear cabinet by a screw connection that is disposed so that it may be reached from said front side of said switchgear cabinet.

6. The modular converter arrangement of claim 3, wherein said DC voltage contact devices of said switching module and of said assigned capacitor module are electrically conductively connected by a screw connection that is disposed so that it may be reached from a front side of said switchgear cabinet.

7. The modular converter arrangement of claim 3, wherein said at least one AC voltage connection device has an additional section arranged parallel to said rail system, said additional section being positioned so that it does not restrict movement of said main modules along said rail system.

* * * * *